(12) United States Patent
Griesert et al.

(10) Patent No.: US 8,018,215 B1
(45) Date of Patent: Sep. 13, 2011

(54) APPARATUS AND METHOD FOR MONITORING THE INDUCTANCE VALUE OF A SWITCHING REGULATOR

(75) Inventors: Nathanael Griesert, Grass Valley, CA (US); Damian Swank, Rocklin, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 433 days.

(21) Appl. No.: 12/147,427

(22) Filed: Jun. 26, 2008

(51) Int. Cl.
*G05F 1/40* (2006.01)

(52) U.S. Cl. .......................... 323/282; 323/224; 363/89

(58) Field of Classification Search .......... 323/282–290, 323/222, 224, 266, 271, 272; 363/21.04, 363/21.06, 21.12, 24, 25, 41, 62, 59, 89, 363/127
See application file for complete search history.

(56) References Cited

U.S. PATENT DOCUMENTS

| | | | |
|---|---|---|---|
| 6,421,262 B1 * | 7/2002 | Saxelby et al. | 363/127 |
| 6,791,306 B2 * | 9/2004 | Walters et al. | 323/288 |
| 6,828,766 B2 | 12/2004 | Corva et al. | |
| 7,019,504 B2 * | 3/2006 | Pullen et al. | 323/283 |
| 7,042,207 B1 | 5/2006 | Broach | |
| 7,045,993 B1 * | 5/2006 | Tomiyoshi | 323/224 |
| 7,307,412 B1 | 12/2007 | Broach | |

OTHER PUBLICATIONS

Payne, Alexander et al., "Inductance-Saturation in Magnetic Circuits," IEEE, CQ-07, 1997.

\* cited by examiner

*Primary Examiner* — Rajnikant Patel
(74) *Attorney, Agent, or Firm* — Frommer Lawrence & Haug LLP; Matthew M. Gaffney

(57) ABSTRACT

A circuit for monitoring the inductance value of a switching regulator is provided. The circuit includes an inductance sensor circuit that is coupled to a switch node of a switching regulator. The inductor sensor circuit includes a switch, a ramp circuit, and a comparison circuit. The switch is arranged to receive a switch control signal that is based, at least in part, on a switching signal of the switching regulator. When the switch control signal is asserted, the comparison circuit receives a comparison input voltage that is based, at least in part, on the inductance value of the switching regulator. The comparison circuit compares the comparison input voltage to a ramp voltage of the ramp circuit and outputs a signal indicative of whether the inductance value of the switching regulator is at or below a predetermined threshold inductance value.

20 Claims, 11 Drawing Sheets

APPARATUS AND METHOD FOR MONITORING THE INDUCTANCE VALUE OF A SWITCHING REGULATOR

FIELD OF THE INVENTION

The invention is related to switching regulators, and in particular but not exclusively, to a circuit and method for monitoring the inductance value of a switching regulator.

BACKGROUND OF THE INVENTION

A switching regulator is often employed in a DC-DC converter, such as a buck converter, a boost converter, or a buck-boost converter. A switching regulator is typically configured to provide an output voltage in response to an input voltage. In general, a switching regulator includes an inductor that is coupled to a switch.

In operation, the inductor current is a triangle wave current based on the opening and closing of the switch, and an output capacitor provides the output voltage from the inductor current. The switch is controlled by a control signal, where the duty cycle or the frequency of the control signal is typically modulated based on negative feedback. Additionally, switching regulators may also include a diode or a switch for rectifying the inductor current.

BRIEF DESCRIPTION OF THE DRAWINGS

Non-limiting and non-exhaustive embodiments of the present invention are described with reference to the following drawings, in which.

DETAILED DESCRIPTION

Figure 1:
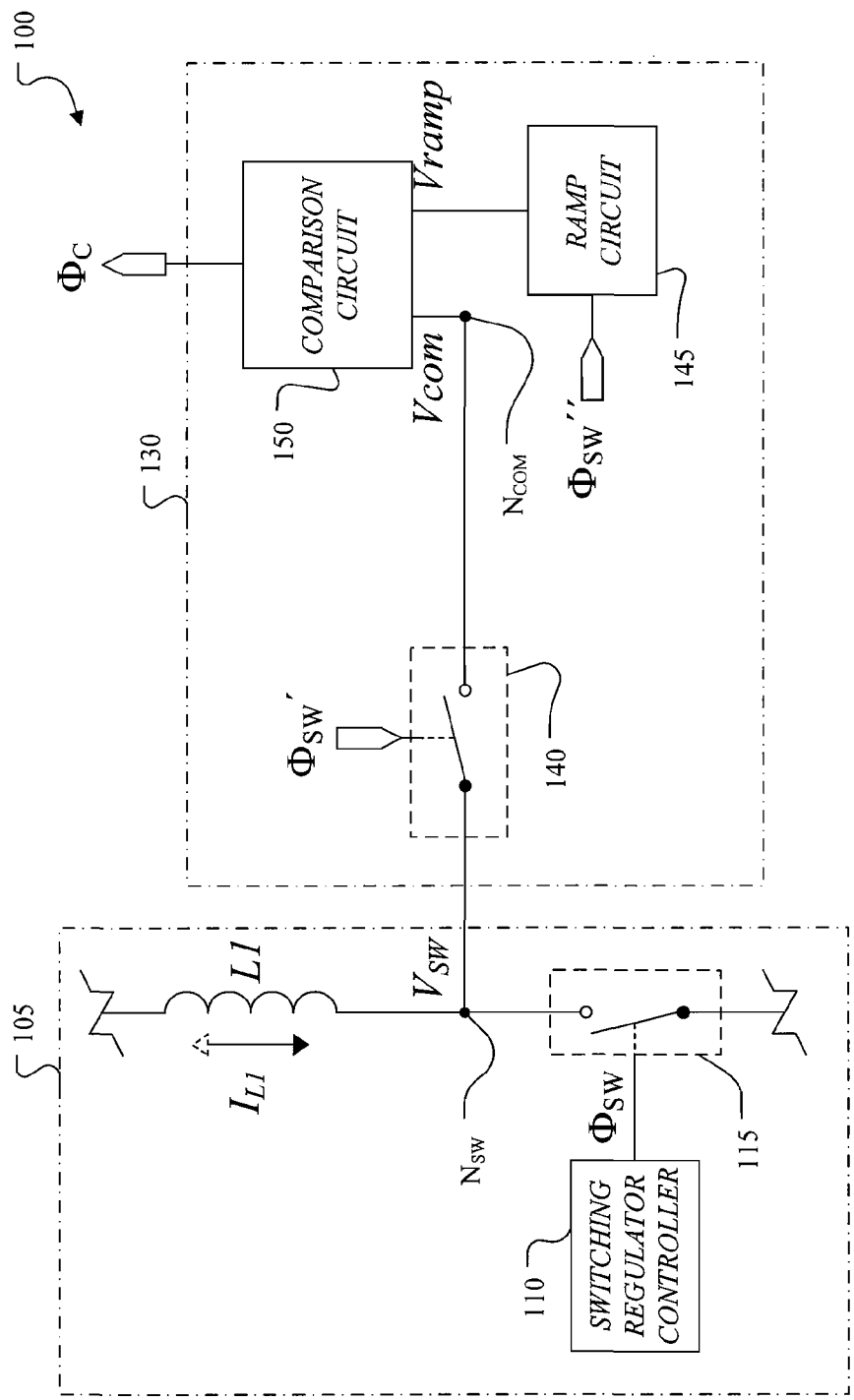
FIG. 1 is a block diagram of an embodiment of a circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

Briefly stated, the invention is related to a circuit that monitors the inductance value of a switching regulator. The circuit includes an inductance sensor circuit that is coupled to a switch node of a switching regulator. The inductor sensor circuit includes a switch, a ramp circuit, and a comparison circuit. The switch is arranged to receive a switch control signal that is based, at least in part, on a switching signal of the switching regulator. When the switch control signal is asserted, the comparison circuit receives a comparison input voltage that is based, at least in part, on the inductance value of the switching regulator. The comparison circuit compares the comparison input voltage to a ramp voltage of the ramp circuit and outputs a signal indicative of whether the inductance value of the switching regulator is at or below a predetermined threshold inductance value.

FIG. 1 is a block diagram of an embodiment of a circuit (100) that includes switching regulator 105 and inductance sensor 130. Switching regulator 105 may include switching regulator controller 110, switch 115, and inductor L1. In one embodiment, switching regulator 105 is an asynchronous switching regulator. In another embodiment, switching regulator 105 is a synchronous switching regulator.

Switching regulator controller 110 is arranged to provide switching signal $\Phi_{SW}$ to a control input of switch 115. Switching signal $\Phi_{SW}$ is asserted to close switch 115 (e.g., when switching signal $\Phi_{SW}$ is high). The duration of time for which switch 115 is opened or closed is based on duty cycle $D_{SW}$ of switching signal $\Phi_{SW}$ and switching period $T_S$.

Inductor L1 is arranged to provide an inductor current $I_{L1}$. Inductor L1 has an inductance value Lval that is related to inductor current $I_{L1}$ and inductor voltage $V_{L1}$ as follows:

$$\frac{dI_{L1}}{dt} = \frac{V_{L1}}{Lval} \quad (1)$$

When switching signal $\Phi_{SW}$ is asserted, switch 115 is closed and inductor current $I_{L1}$ passes through switch 115. Also, when switching signal $\Phi_{SW}$ is asserted, switch node voltage $V_{SW}$ at switch node $N_{SW}$ is determined as follows:

$$V_{SW} = R_{SW}\frac{dI_{L1}}{dt}D_{SW}T_S + V_{SW\_initial} \quad (2)$$

where switch on-resistance $R_{SW}$ is the on-resistance of switch 115 and initial switch node voltage $V_{SW\_initial}$ is the initial voltage at switch node $N_{SW}$ when switching signal $\Phi_{SW}$ is first asserted. Equation 2 can also be rewritten such that switch node voltage $V_{SW}$ is based on inductance value Lval and inductor voltage $V_{L1}$ as follows:

$$V_{SW} = R_{SW}\frac{V_{L1}}{Lval}D_{SW}T_S + V_{SW\_initial} \quad (3)$$

Inductance sensor 130 may monitor inductance value Lval by evaluating the rate at which switch node voltage $V_{SW}$ changes when switching signal $\Phi_{SW}$ is asserted. When switching signal $\Phi_{SW}$ is asserted, Equation 3 dictates that switch node voltage $V_{SW}$ changes at a rate based, at least in part, on inductance value Lval. The larger the value of inductance value Lval, the slower the rate at which switch node voltage $V_{SW}$ changes. The smaller the value of inductance value Lval, the faster the rate at which switch node voltage $V_{SW}$ changes.

Inductance sensor 130 is coupled to switching regulator 105. Inductance sensor 130 includes switch 140, ramp circuit 145, and comparison circuit 150. Switch 140 is coupled to switch node $N_{SW}$. Switch 140 is arranged to receive switch control signal $\Phi_{SW}'$ at a control input. Switch control signal $\Phi_{SW}'$ is based, at least in part, on switching signal $\Phi_{SW}$ such that switch 140 is generally closed when switch 115 is closed and switch 140 is generally open when switch 115 is open. In one embodiment switch control signal $\Phi_{SW}'$ is substantially the same as switching signal $\Phi_{SW}$ and switch control signal $\Phi_{SW}'$ is asserted at substantially the same time as switching signal $\Phi_{SW}$. In another embodiment, switch control signal $\Phi_{SW}'$ is substantially the same as switching signal $\Phi_{SW}$ except that switch control signal $\Phi_{SW}'$ is delayed by a delay time such that switch control signal $\Phi_{SW}'$ is asserted subsequent to switching signal $\Phi_{SW}$ being asserted. In other embodiments, however, switch control signal $\Phi_{SW}'$ can be asserted differently.

When switch control signal $\Phi_{SW}'$ is asserted, switch 140 is closed and switch 140 electrically couples switch node $N_{SW}$ to comparison node $N_{COM}$. Also, when switch control signal $\Phi_{SW}'$ is asserted, comparison input voltage Vcom at comparison node $N_{COM}$ is substantially equal to switch node voltage $V_{SW}$ at switch node $N_{SW}$ as follows:

$$Vcom = V_{SW} = R_{SW}\frac{V_{L1}}{Lval}D_{SW}T_S + V_{SW\_initial} \quad (4)$$

When switch control signal $\Phi_{SW}'$ is not asserted, switch 140 is open and switch 140 electrically isolates switch node $N_{SW}$ from comparison node $N_{COM}$. In one embodiment, comparison input voltage Vcom can float when switch control signal $\Phi_{SW}'$ is not asserted. In another embodiment, comparison input voltage Vcom can be set to a reference level when switch control signal $\Phi_{SW}'$ is not asserted.

Ramp circuit 145 is arranged to provide ramp voltage Vramp at an output. Ramp circuit 145 is also arranged to receive ramp control signal $\Phi_{SW}''$ at a control input. In one embodiment, ramp control signal $\Phi_{SW}'$ is substantially the same as switch control signal $\Phi_{SW}'$ and ramp control signal $\Phi_{SW}''$ is asserted at substantially the same time as switch control signal $\Phi_{SW}'$. In another embodiment, ramp control signal $\Phi_{SW}'$ is substantially the same as switch control signal $\Phi_{SW}'$ except that ramp control signal $\Phi_{SW}''$ is delayed by a delay time such that ramp control signal $\Phi_{SW}''$ is asserted subsequent to switch control signal $\Phi_{SW}'$ being asserted. In other embodiments, however, ramp control signal $\Phi_{SW}''$ can be asserted differently.

When ramp control signal $\Phi_{SW}''$ is asserted, ramp circuit 145 provides ramp voltage Vramp as follows:

$$Vramp = XD_{SW}T_S + Vramp\_initial \quad (5)$$

where X is a constant defined by the properties of ramp circuit 145 and initial ramp voltage Vramp_initial is the initial value of ramp voltage Vramp when ramp control signal $\Phi_{SW}''$ is first asserted.

In general, ramp voltage Vramp changes at a substantially monotonic rate when ramp control signal $\Phi_{SW}''$ is asserted. For example, in one embodiment, ramp voltage Vramp increases when ramp control signal $\Phi_{SW}''$ is asserted, but does not decrease. In another embodiment, ramp voltage Vramp decreases when ramp control signal $\Phi_{SW}''$ is asserted, but does not increase.

When ramp control signal $\Phi_{SW}''$ is unasserted, ramp circuit 145 resets such that ramp voltage Vramp becomes equal to initial ramp voltage Vramp_initial. In one embodiment, ramp voltage Vramp may ramp up/down to the value of initial ramp voltage Vramp_initial when ramp control signal $\Phi_{SW}''$ is unasserted. In another embodiment, ramp voltage Vramp may reset to the value of initial ramp voltage Vramp_initial when ramp control signal $\Phi_{SW}''$ is unasserted.

Comparison circuit 150 is arranged to receive comparison input voltage Vcom at a first input and ramp voltage Vramp at a second input. Also, comparison circuit 150 is arranged to provide a comparison signal $\Phi_C$ at an output. The comparison signal $\Phi_C$ is based, at least in part, on a comparison between comparison input voltage Vcom and ramp voltage Vramp. When switching signal $\Phi_{SW}$, switch control signal $\Phi_{SW}'$, and ramp control signal $\Phi_{SW}''$ are all asserted, comparison node $N_{COM}$ is electrically coupled to switch node $N_{SW}$, comparison input voltage Vcom is substantially equal to switch node voltage $V_{SW}$, and ramp circuit 145 ramps ramp voltage Vramp.

Also, when switching signal $\Phi_{SW}$, switch control signal $\Phi_{SW}'$, and ramp control signal $\Phi_{SW}''$ are all asserted, the comparison signal $\Phi_C$ output by comparison circuit 150 is indicative of one of two conditions. The first condition occurs when comparison input voltage Vcom is generally less than ramp voltage Vramp. This corresponds to when comparison signal $\Phi_C$ is not asserted and inductance value Lval is greater than predetermined threshold inductance Lmin. The second condition occurs when comparison input voltage Vcom is generally greater than or equal to ramp voltage Vramp. This corresponds to when comparison signal $\Phi_C$ is asserted and inductance value Lval is less than or equal to predetermined threshold inductance Lmin. In one embodiment, when inductance value Lval is less than or equal to predetermined threshold inductance Lmin, comparison signal $\Phi_C$ indicates that inductor L1 has become shorted. In another embodiment, when inductance value Lval is less than or equal to predetermined threshold inductance Lmin, comparison signal $\Phi_C$ indicates that inductor L1 may have degraded such that inductor L1 no longer performs as intended.

In some embodiments, comparison circuit 150 includes a comparator and comparison signal $\Phi_C$ is a digital signal. In some of these embodiments, the comparator is arranged to trip when comparison input voltage Vcom becomes equal to or greater than ramp voltage Vramp. In other of these embodiments, the comparator has a certain amount of hysteresis. As such, the comparator may be arranged to trip differently.

In another embodiment, comparison circuit 150 includes a differential amplifier and comparison signal $\Phi_C$ is an analog signal that is correlative with a difference in magnitude between comparison input voltage Vcom and ramp voltage Vramp. For example, such a comparison can be indicative of the difference in magnitude between inductance value Lval and predetermined threshold inductance Lmin.

When switching signal $\Phi_{SW}$, switch control signal $\Phi_{SW}'$, and ramp control signal $\Phi_{SW}''$ are all unasserted, comparison signal $\Phi_C$ may not provide any information regarding inductance value Lval.

Figure 2:
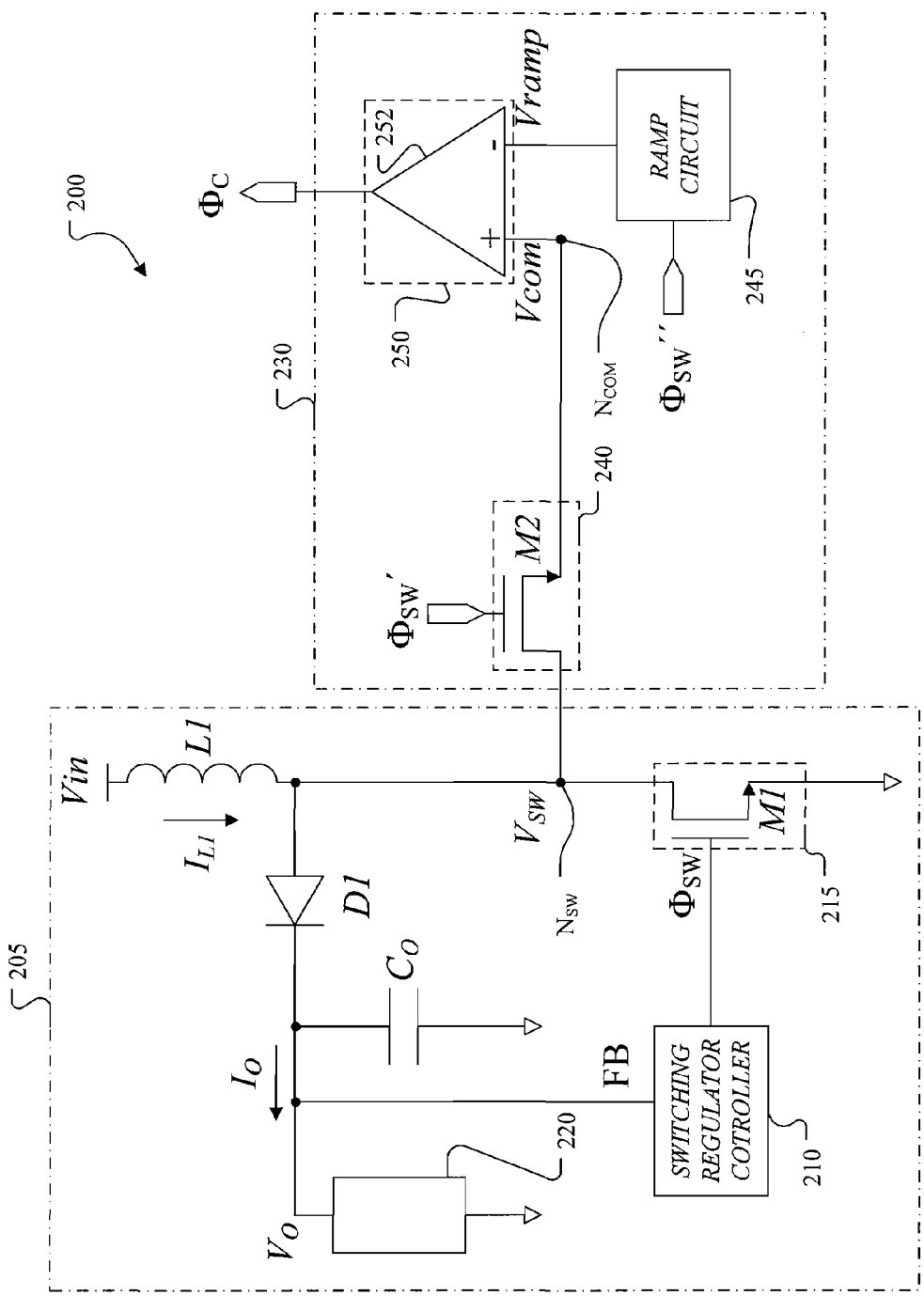
FIG. 2 is a block diagram of an embodiment of the circuit of FIG. 1.

FIG. 2 is a block diagram of an embodiment of a circuit (200), which may be employed as an embodiment of the circuit (100) of FIG. 1.

Boost converter 205 is arranged to receive DC supply Vin and to provide DC output $V_O$ such that DC output $V_O$ is greater than DC supply Vin. Inductance sensor 230 is arranged to monitor inductance value Lval associated with boost converter 205. Comparison circuit 250 includes comparator 252, which is arranged to provide comparison signal $\Phi_C$.

Boost converter 205 includes diode D1 and output capacitor $C_O$. In one embodiment, diode D1 may be replaced with another type of rectifying device, such as a synchronous switch. In another embodiment, additional circuit elements may be coupled to the output capacitor $C_O$, such as one or more capacitors, inductors, and/or resistors for filtering DC ouput $V_O$ and/or output current $I_O$.

Switching regulator controller 210 is arranged to control regulation via switch 215. Switching regulator controller 210 is also arranged to provide switching signal $\Phi_{SW}$ based, at least in part, on feedback signal FB. In one embodiment, feedback signal FB is a current signal. In another embodiment, feedback signal FB is a voltage signal.

In one embodiment, switching regulator controller 210 is a current mode pulse width modulation (PWM) regulator controller. In such an embodiment, switching regulator controller 210 may include an error amp and a pulse width modulation circuit. Alternatively, switching regulator controller 210 may be a voltage mode PWM regulator controller.

In another embodiment, switching regulator controller 210 is a hysteretic bang-bang regulator controller, and switching regulator controller 210 includes a hysteretic comparator. In yet another embodiment, switching regulator controller 210 is a constant on-time (COT) regulator controller, and switching regulator controller 210 includes a comparator and a one-shot circuit. In still yet another embodiment, switching regulator controller includes a gated oscillator. In these various embodiments, the error amplifier (e.g., in the case of a PWM regulator controller or the like), or the comparator (e.g., in the case of a hysteretic bang-bang regulator controller, COT regulator controller, or the like) may be referred to generically as a regulator comparison circuit. In some embodiments, the regulator comparison circuit receives a reference signal Vref (not shown in FIG. 2) at one input of the regulator comparison circuit and feedback signal FB at another input of the regulator comparison circuit.

Switch 215 includes power transistor M1. Switch 240 of inductance sensor 230 includes power transistor M2. In one embodiment, power transistor M2 is located on-chip. In another embodiment, power transistor M2 is located off-chip.

When switching signal $\Phi_{SW}$ is not asserted, inductor current $I_{L1}$ does not pass through power transistor M1. Also, when switching signal $\Phi_{SW}$ is not asserted, inductor L1 provides inductor current $I_{L1}$ to output capacitor $C_O$ and/or to load 220. Switch node voltage $V_{SW}$ is generally at a level about equal to the voltage drop across diode D1 added to DC output Vo when switching signal $\Phi_{SW}$ is not asserted.

When switching signal $\Phi_{SW}$ is asserted, inductor current $I_{L1}$ passes through switch node $N_{SW}$ and power transistor M1. Also, when switching signal $\Phi_{SW}$ is asserted, inductor current $I_{L1}$ increases at a rate based, at least in part, on inductance value Lval.

When switch control signal $\Phi_{SW}'$ is asserted, switching signal $\Phi_{SW}$ is also asserted, and comparison input voltage Vcom generally corresponds to switch node voltage $V_{SW}$. During this time, the slope of comparison input voltage Vcom is inversely proportional to inductance value Lval as dictated by Equation 4. Accordingly, in one embodiment, if inductance value Lval decreases, switch node voltage $V_{SW}$ increases at a faster rate.

When ramp control signal $\Phi_{SW}''$ is asserted, ramp voltage Vramp changes at a predetermined rate that is based on predetermined threshold inductance value Lmin. In particular, the slope of ramp voltage Vramp is based, at least in part, on predetermined threshold inductance value Lmin. As described above, the slope of ramp voltage Vramp may be dictated by constant X of Equation 5.

In one embodiment, ramp circuit 245 is configured such that under normal operating conditions, the slope of ramp voltage Vramp is substantially equal to the slope of comparator voltage Vcom. When the slope of comparator voltage Vcom exceeds the slope of ramp voltage Vramp, this may indicate that inductor L1 has shorted and/or inductance value Lval is below predetermined threshold inductance value Lmin.

In general, comparator 252 is configured to compare the slope of ramp voltage Vramp with the slope of comparison input voltage Vcom. To do this, comparator 252 compares the voltage level of ramp voltage Vramp with the voltage level of comparison input voltage Vcom. In many embodiments, ramp voltage Vramp and switch node voltage $V_{SW}$ have different initial voltages when switch control signal $\Phi_{SW}'$ and ramp control signal $\Phi_{SW}''$ are first asserted. However, ramp voltage Vramp can be aligned with comparison input voltage Vcom by appropriately DC shifting ramp voltage Vramp and/or switch node voltage $V_{SW}$ (described in more detail below).

Figure 3:
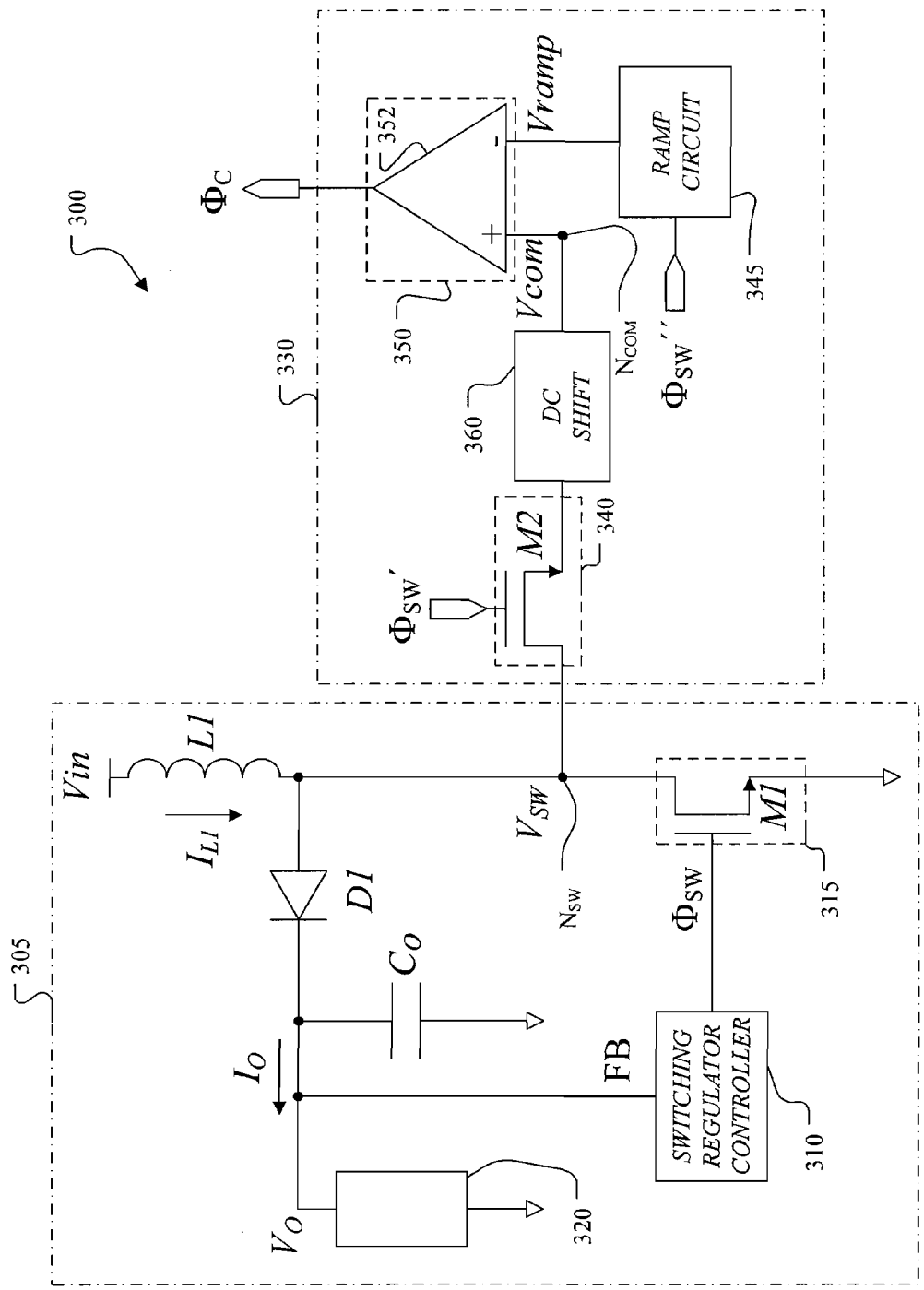
FIG. 3 is a block diagram showing an embodiment of the circuit of FIG. 2 in which the circuit includes an embodiment of a DC shift component.

FIG. 3 is a block diagram of an embodiment of a circuit (300), which may be employed as an embodiment of the circuit (200) of FIG. 2.

Inductance sensor 330 further includes DC shift component 360. In general, DC shift component 360 is configured to DC shift comparison input voltage Vcom such that comparison input voltage Vcom and ramp voltage Vramp ramp from substantially the same reference level. In one embodiment, comparison input voltage Vcom is DC shifted down by an amount equal to the value of initial switch node voltage $V_{SW\_initial}$ as follows:

$$Vcom = V_{SW} - V_{SW\_initial} = R_{SW}\frac{V_{L1}}{Lval}D_{SW}T_S \qquad (6)$$

In this embodiment, when switch control signal $\Phi_{SW}'$ is asserted, comparison input voltage Vcom increases from a reference level of about zero volts. Accordingly, ramp circuit 345 may be configured such that initial ramp voltage Vramp_initial is also at a reference level of about zero volts.

In another embodiment, DC shift component 360 may be incorporated into ramp circuit 345 or be coupled between ramp circuit 345 and an input of comparison circuit 352. In these embodiments, initial ramp voltage Vramp_intial may be set such that initial ramp voltage Vramp initial is equal to the value of initial switch node voltage $V_{SW\_initial}$ when ramp control signal $\Phi_{SW}''$ is first asserted.

Figure 4:
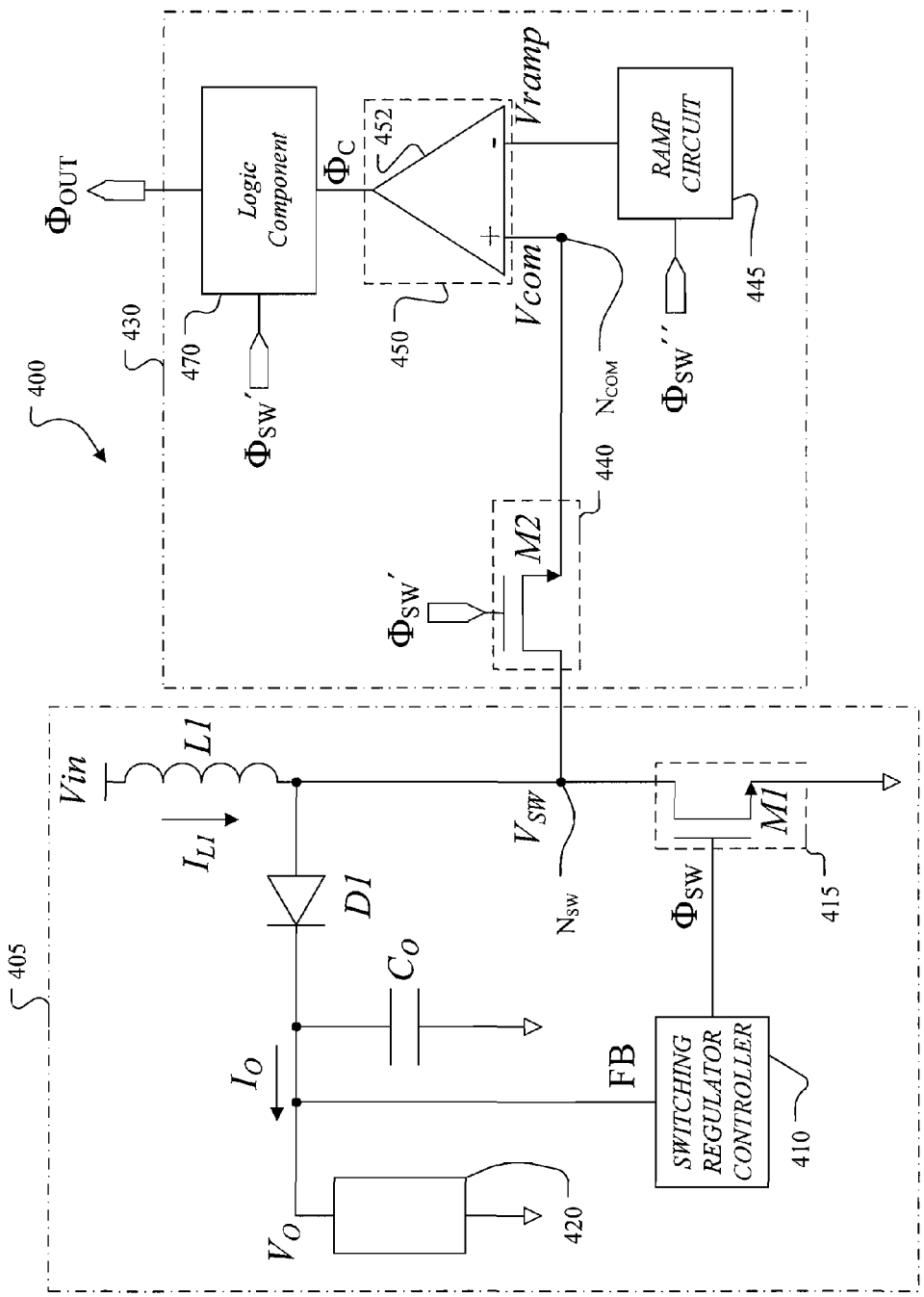
FIG. 4 is a block diagram showing an embodiment of the circuit of FIG. 2 in which the circuit includes an embodiment of a logic component.

FIG. 4 is a block diagram of an embodiment of a circuit (400), which may be employed as an embodiment of the circuit (200) of FIG. 2.

Inductance sensor 430 further includes logic component 470. Logic component 470 may be arranged to receive comparison signal $\Phi_C$ at a first input. Also, logic component 470 may be arranged to receive a control signal that is based, at least in part, on switching signal $\Phi_{SW}'$ at a second input. Logic component 470 is also arranged to provide an output signal $\Phi_{OUT}$ at an output.

Output signal $\Phi_{OUT}$ may be based, at least in part, on comparison signal $\Phi_C$ and switching signal $\Phi_{SW}$. In one embodiment, output signal $\Phi_{OUT}$ is based on comparison signal $\Phi_C$ when switch control signal $\Phi_{SW}'$ is asserted, and not based on comparison signal $\Phi_C$ otherwise. In such an embodiment, logic component 470 may disregard comparison signal $\Phi_C$ when comparison node NCOM is not electrically coupled to switch node $N_{SW}$. In another embodiment, logic component 470 may be configured such that output signal $\Phi_{OUT}$ may indicate whether comparison signal $\Phi_C$ has been high/low for a predetermined amount of time. In yet another embodiment, logic component 470 may be configured such that output signal $\Phi_C$ indicates whether comparison signal $\Phi_C$ has gone high/low a predetermined number of times.

In one embodiment, logic component 470 may include a state machine. In such an embodiment, the state machine may change from one state to another each time that comparison signal $\Phi_C$ transitions from being unasserted to asserted with a given time period. For example, such a state machine may be configured to assert output signal $\Phi_{OUT}$ when comparison signal $\Phi_C$ has been asserted three or more times within a period defined by switching signal $\Phi_{SW}$. In another embodiment, logic component 470 includes a latch (described in more detail below).

Figure 5:
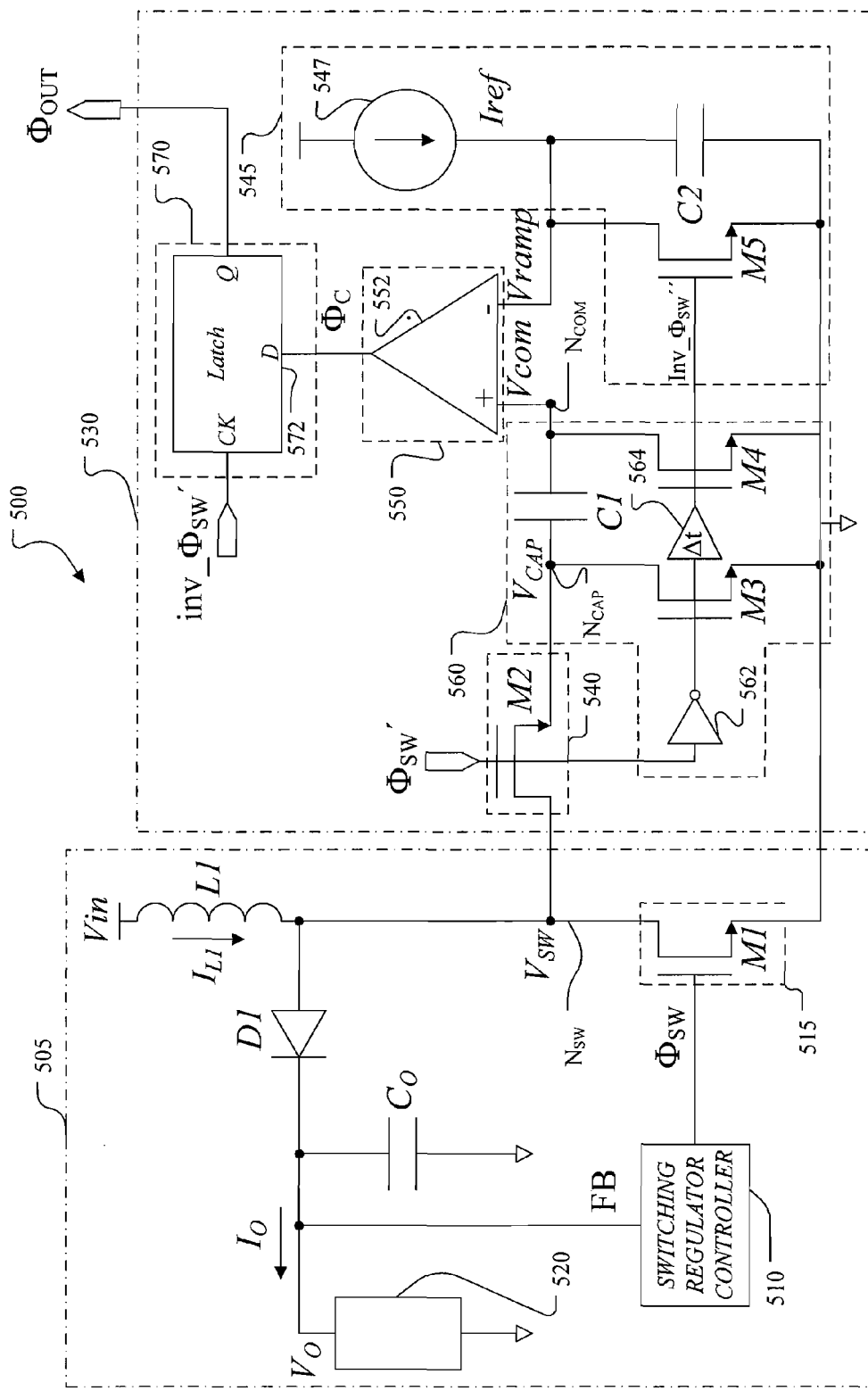
FIG. 5 is a block diagram showing an embodiment of the circuit of FIG. 4 in which the circuit includes an embodiment of a DC shift component.

FIG. 5 is a block diagram of an embodiment of a circuit (500), which may be employed as an embodiment of the circuit (400) of FIG. 4.

Inductance sensor 530 further includes DC shift component 560. DC shift component 560 includes inverter 562, delay gate 564 with delay time Δt, capacitor C1, transistor M3, and transistor M4. DC shift component 560 is arranged such that when switch control signal $\Phi_{SW}'$ is unasserted, transistors M3 and M4 discharge capacitor C1.

DC shift component 560 is also arranged such that when switch control signal $\Phi_{SW}'$ is asserted, transistor M3 no longer couples capacitor node $N_{CAP}$ to ground, and capacitor input voltage $V_{CAP}$ is substantially equal to switch node voltage $V_{SW}$. Also when switch control signal $\Phi_{SW}'$ is asserted, transistor M4 couples comparison node $N_{COM}$ to ground for delay time Δt such that the voltage across capacitor C1 becomes the DC shift voltage of DC shift component 560. This DC shift voltage is approximately equal to initial switch node voltage $V_{SW\_initial}$.

Ramp circuit 545 includes capacitor C2, current source 547, and transistor M5. Capacitor C2 may be located on or off chip. Current source 547 may be a current mirror or other type of circuit that provides reference current Tref. Transistor M5 is arranged to receive inverted ramp control signal inv_$\Phi_{SW}''$ at a control input. In many embodiments, inverted ramp control signal inv_$\Phi_{SW}''$ is generally similar to ramp control signal $\Phi_{SW}''$ except that inverted ramp control signal inv_$\Phi_{SW}''$ is inverted.

While inverted ramp control signal inv_$\Phi_{SW}''$ is asserted, transistor M5 pulls ramp voltage Vramp to ground and capacitor C2 discharges. This sets initial ramp voltage Vramp initial to a value of about zero volts. When inverted ramp control signal inv_$\Phi_{SW}''$ is not asserted, transistor M5 does not conduct, and ramp voltage Vramp ramps as follows:

$$\text{Vramp} = XD_{SW}T_S \qquad (7)$$

$$\text{where} X = \frac{Iref}{C2} \qquad (8)$$

While switch control signal $\Phi_{SW}'$ is asserted and inverted ramp control signal inv_$\Phi_{SW}''$ is not asserted, comparator 552 compares comparison input voltage Vcom to ramp voltage Vramp to detect whether inductance value Lval of inductor L1 is less than or equal to predetermined threshold inductance Lmin. The trip point of comparator 552 may be set to predetermined threshold inductance Lmin. Predetermined threshold inductance Lmin may be determined by setting Equations 6 and 7 equal to one another and solving for predetermined threshold inductance Lmin as follows:

$$L\min = \frac{R_{SW}V_{L1}C2}{Iref} \qquad (9)$$

By approximating inductor voltage $V_{L1}$ as DC supply Vin, predetermined threshold inductance Lmin becomes:

$$L\min = \frac{R_{SW}VinC2}{Iref} \qquad (10)$$

The relationship expressed in Equation 10 is beneficial because switch on-resistance $R_{SW}$ is inversely proportional to DC supply Vin.

Logic component 570 includes latch 572. Latch 572 is arranged to receive comparison signal $\Phi_C$ at a first input. Latch 572 is also arranged to receive inverted switching signal inv_$\Phi_{SW}'$ at a second input. In addition, latch 572 is arranged to provide output signal $\Phi_{OUT}$ based on comparison signal $\Phi_C$ and inverted switching signal inv_$\Phi_{SW}'$. When inv_$\Phi_{SW}'$ triggers latch 572, latch 572 captures the logic level of comparison signal $\Phi_C$ (e.g., high) and provides this logic level as output signal $\Phi_{OUT}$.

Figure 6:
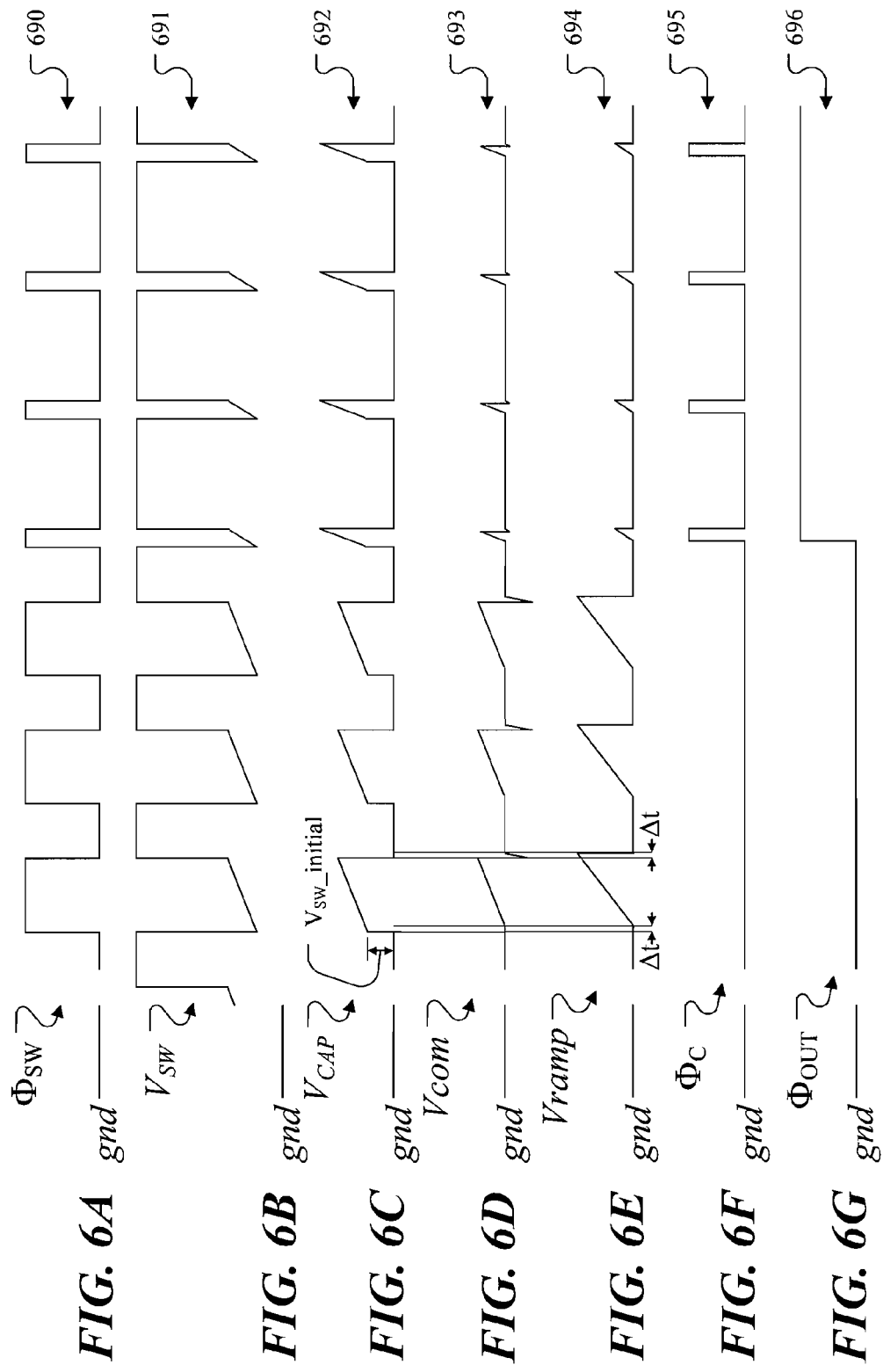
FIGS. 6A-6G are timing diagrams of waveforms of embodiments of signals for an embodiment of the circuit of FIG. 5.

FIGS. 6A-6G are timing diagrams of waveforms of embodiments of signals of the circuit (500) of FIG. 5. FIG. 6A illustrates waveform 690 of an embodiment of switching signal $\Phi_{SW}$. For ease of understanding, waveforms representing switch control signal $\Phi_{SW}'$, ramp control signal $\Phi_{SW}''$, and inverted switch control signal inv_$\Phi_{SW}'$ are not illustrated in conjunction with FIGS. 6A-G. As discussed above, switch control signal $\Phi_{SW}'$ and ramp control signal $\Phi_{SW}''$ may be substantially similar to switching control signal $\Phi_{SW}$, although they may be delayed from switching signal $\Phi_{SW}$ and/or inverted in some embodiments. In addition, inverted switch control signal inv_$\Phi_{SW}'$ may be substantially similar to switch control signal $\Phi_{SW}'$, except switch control signal inv_$\Phi_{SW}'$ is inverted.

FIGS. 6B-6G illustrate waveforms 691-696 of embodiments of switching signal $V_{SW}$, input capacitor voltage $V_{CAP}$, comparison input voltage Vcom, ramp voltage Vramp, comparison signal $\Phi_C$, and output signal $\Phi_{OUT}$, respectively. As shown in waveform 691, switch node voltage $V_{SW}$ remains constant when switching signal $\Phi_{SW}$ is unasserted.

When switching signal $\Phi_{SW}$ is asserted, switch node voltage $V_{SW}$ initially decreases. At this point, switch control signal $\Phi_{SW}'$ is asserted and capacitor C1 stores initial switch node voltage $V_{SW\_initial}$, as shown in waveform 692. Waveform 692 also shows capacitor voltage $V_{CAP}$ tracking switch node voltage $V_{SW}$ while switch control signal $\Phi_{SW}'$ is asserted.

Figure 7:
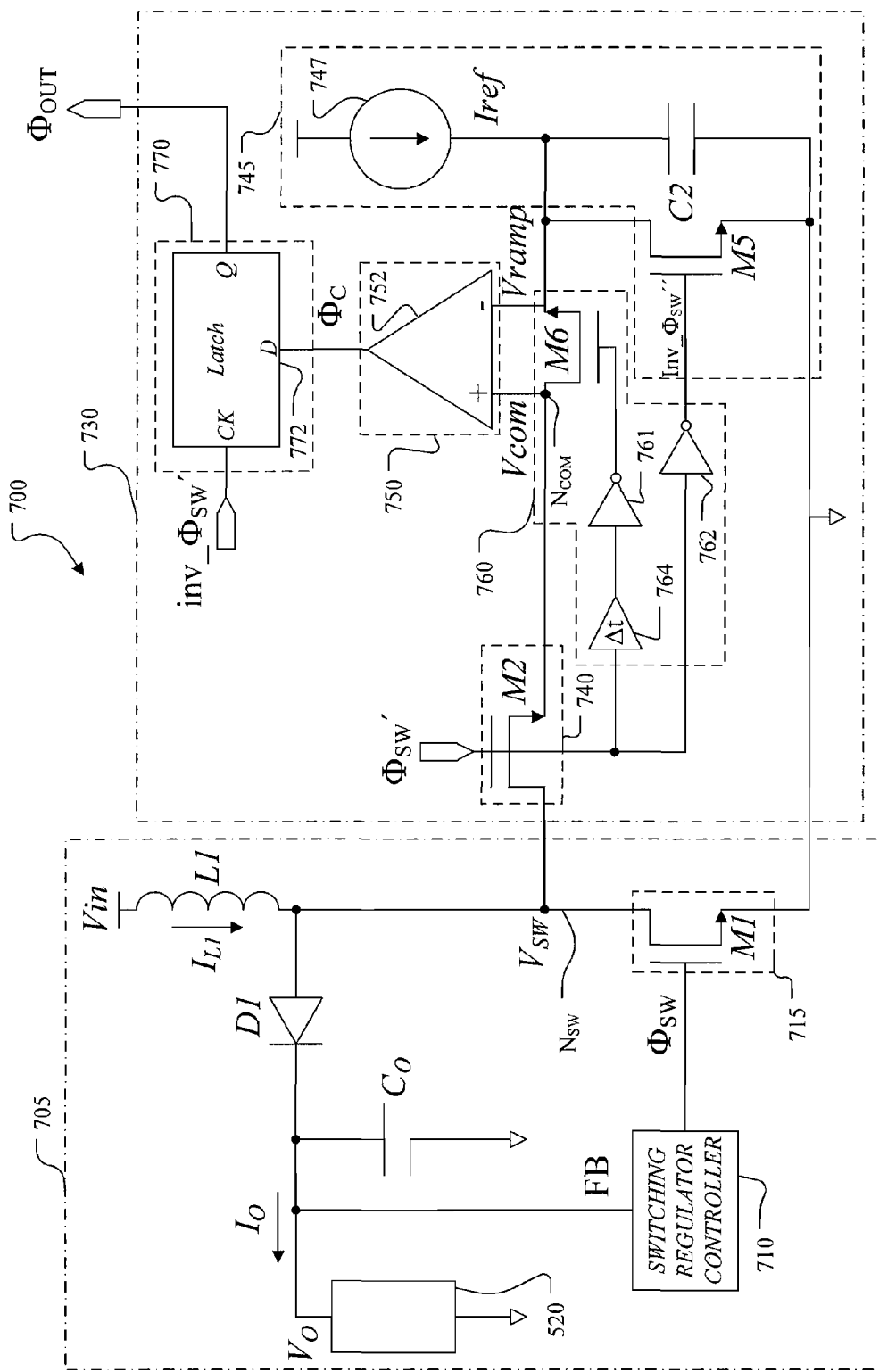
FIG. 7 is a block diagram showing an embodiment of the circuit of FIG. 4 in which the circuit includes an embodiment of a DC shift component.

Also, while switch control signal $\Phi_{SW}'$ is asserted and after delay time $\Delta t$, comparison input voltage Vcom begins to follow capacitor voltage $V_{CAP}$ and ramp voltage Vramp begins to ramp, as shown in waveforms 693 and 694, respectively. While ramp voltage Vramp remains greater than comparison input voltage Vcom, comparison signal $\Phi_C$ and output signal $\Phi_{OUT}$ are low, as shown by waveforms 695 and 696, respectively. When ramp voltage Vramp is less than or equal to comparison input voltage Vcom, comparison signal $\Phi_C$ goes high, causing output signal $\Phi_{OUT}$ to latch high. FIG. 7 is a block diagram of an embodiment of a circuit (700), which may be employed as an embodiment of the circuit (400) of FIG. 4.

Inductance sensor 730 further includes DC shift component 760. DC shift component 760 includes inverters 761 and 762, delay gate 764 with delay time $\Delta t$, and transistor M6. DC shift component 760 is arranged such that when switch control signal $\Phi_{SW}'$ is unasserted, transistor M6 electrically couples comparison node NCOM to ground via transistor M5 of ramp circuit 745.

Also, DC shift component 760 is arranged such that when switch control signal $\Phi_{SW}'$ is asserted, transistor M6 remains conducting for delay time $\Delta t$. During delay time $\Delta t$, the voltage across capacitor C2 becomes approximately equal to initial switch node voltage $V_{SW\_initial}$.

After delay time $\Delta t$ and while switch control signal $\Phi_{SW}'$ is asserted, comparison input voltage Vcom increases from the voltage level of initial switch node voltage $V_{SW\_initial}$, and ramp voltage Vramp initial also increases from the voltage level of initial switch node voltage $V_{SW\_initial}$ due to the voltage stored across capacitor C2. The ramp voltage Vramp during this time may be as follows:

$$\text{Vramp} = XD_{SW}T_S + V_{SW\_initial} \quad (11)$$

$$\text{where } X = \frac{Iref}{C2} \quad (12)$$

Ramp circuit 745 may operate in a manner that is generally similar to ramp circuit 545 of FIG. 5. However, in this embodiment inverted ramp control signal inv_$\Phi_{SW}''$ is not delayed by delay time $\Delta t$.

Comparator 752 is arranged to compare comparison input voltage Vcom with ramp voltage Vramp. The trip point of comparator 752 may be determined by setting Equation 4 equal to Equation 11, and solving for predetermined threshold inductance Lmin. The predetermined threshold inductance Lmin may have a value as dictated by Equation 10.

Figure 8:
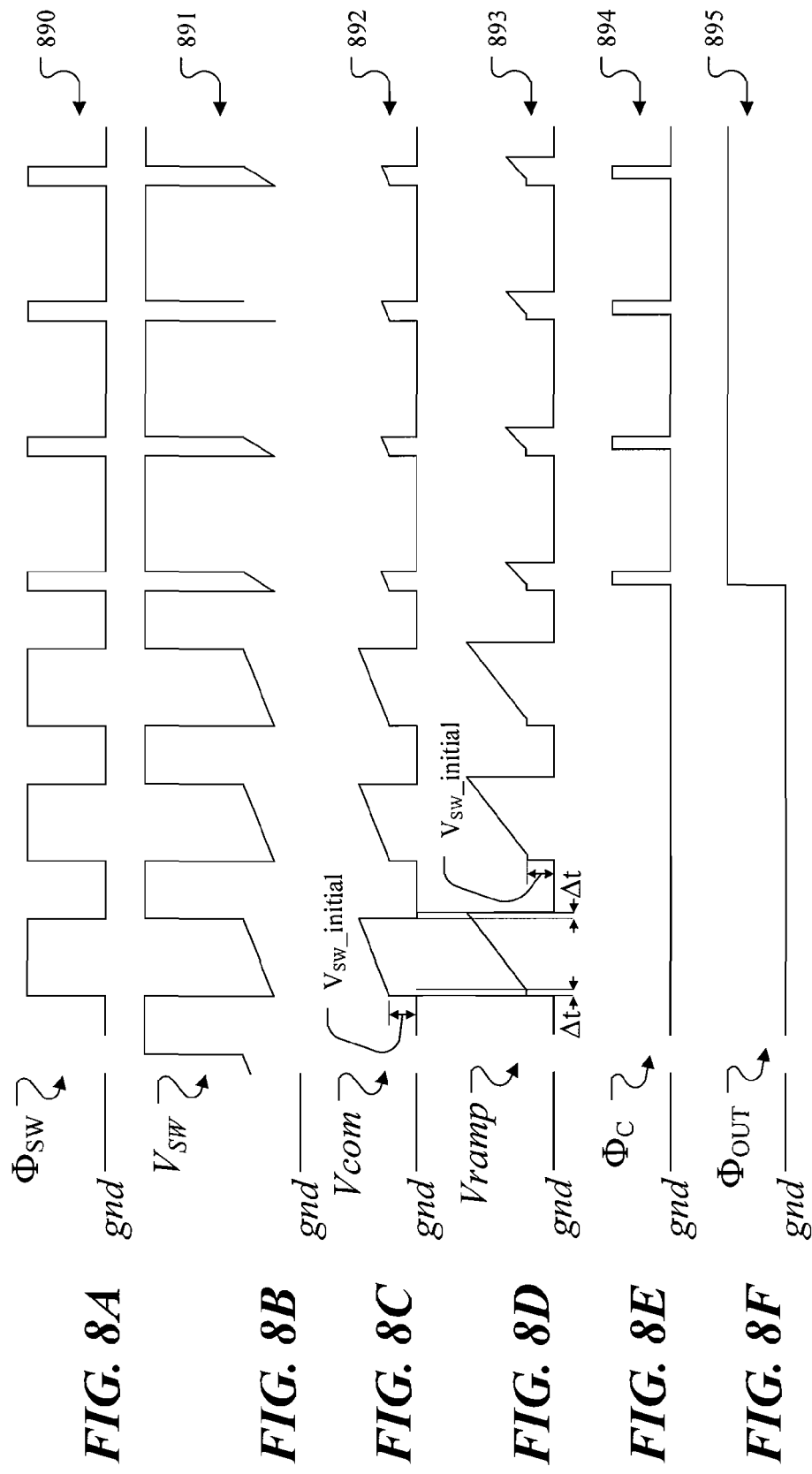
FIGS. 8A-8F are timing diagrams of waveforms of embodiments of signals for an embodiment of the circuit of FIG. 7.

FIGS. 8A-8F are timing diagrams of waveforms of embodiments of signals of the circuit (700) of FIG. 7. FIG. 8A illustrates waveform 890 of an embodiment of switching signal $\Phi_{SW}$. For ease of understanding, waveforms representing switch control signal $\Phi_{SW}'$, ramp control signal $\Phi_{SW}''$, and inverted switch control signal inv_$\phi_{SW}'$ are not illustrated in conjunction with FIGS. 8A-F.

FIGS. 8B-8F illustrate waveforms 691-696 of embodiments of switching signal $V_{SW}$, comparison input voltage Vcom, ramp voltage Vramp, comparison signal $\Phi_C$, and output signal $\Phi_{OUT}$, respectively. As shown in waveform 891, switch node voltage $V_{SW}$ remains constant when switching signal $\Phi_{SW}$ is unasserted. When switching signal $\Phi_{SW}$ is asserted, switch node voltage $V_{SW}$ initially decreases. When switch control signal $\Phi_{SW}'$ is asserted, comparison input voltage Vcom follows switch node voltage $V_{SW}$, as shown by waveform 892.

Also, when switch control signal $\Phi_{SW}'$ is asserted, ramp voltage Vramp follows comparison input voltage Vcom for delay time $\Delta t$, as shown in waveform 893. During this time, capacitor C2 stores initial switch node voltage $V_{SW\_initial}$. After delay time $\Delta t$, ramp voltage Vramp ramps from initial switch node voltage $V_{SW\_initial}$ until ramp signal $\Phi_{SW}''$ is unasserted.

While ramp voltage Vramp remains greater than comparison input voltage Vcom, comparison signal $\Phi_C$ and output signal $\Phi_{OUT}$ are low, as shown by waveforms 894 and 985, respectively. When ramp voltage Vramp is less than or equal to comparison input voltage Vcom, comparison signal $\Phi_C$ goes high, causing output signal $\Phi_{OUT}$ to latch high.

Figure 9:
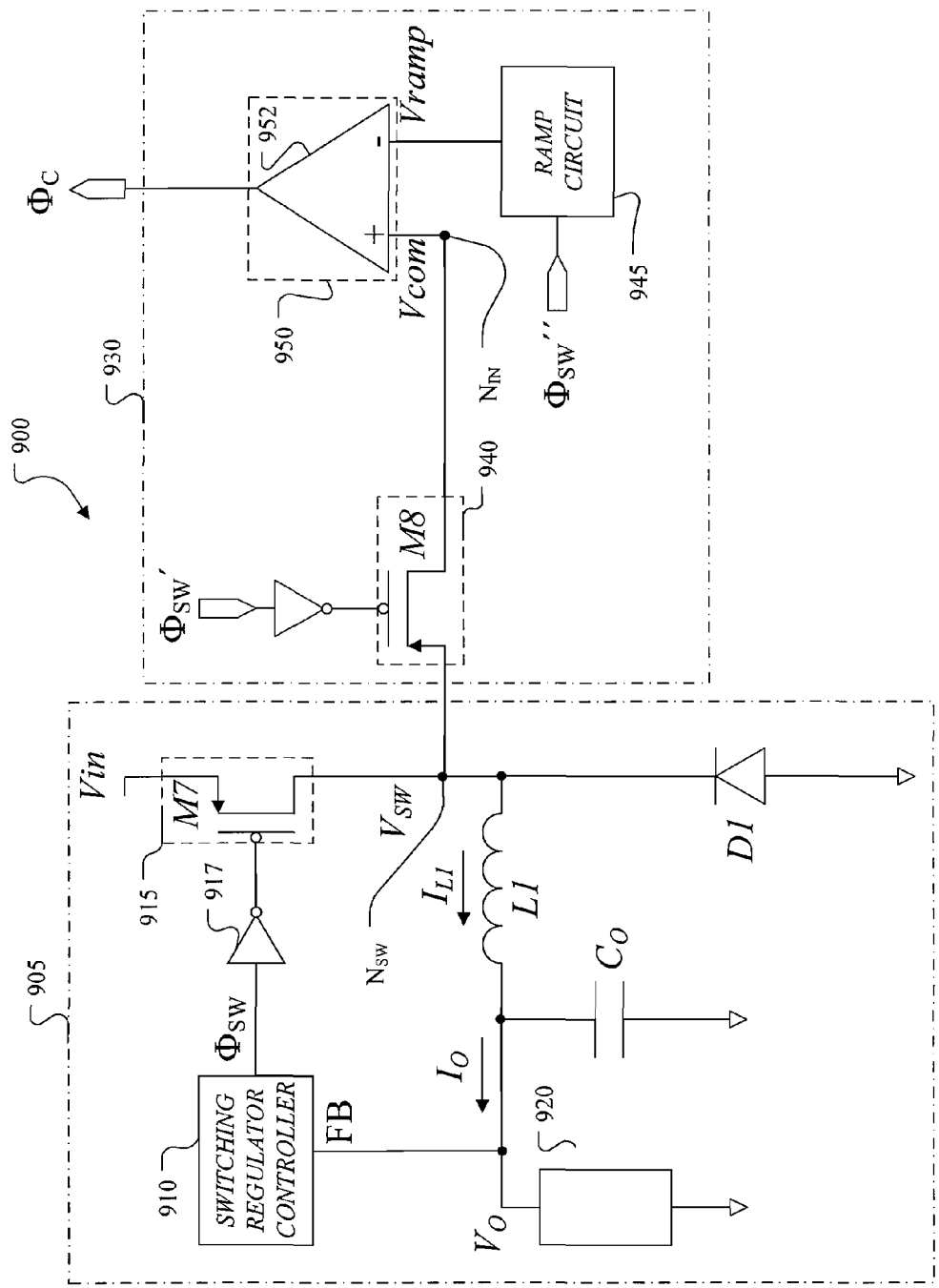
FIG. 9 is a block diagram of yet another embodiment of the circuit of FIG. 1.

FIG. 9 is a block diagram of an embodiment of a circuit (900), which may be employed as an embodiment of the circuit (100) of FIG. 1.

Similar to boost converter 205, buck converter 905 includes diode D1 and output capacitor $C_O$. Switching regulator controller 910 is also arranged to receive feedback signal FB. In addition, switch 915 includes power transistor M7, and power transistor M7 is coupled to switching regulator controller 910 via inverter 917. Also, similar to switch 240, switch 940 includes transistor M8.

Buck converter 905 is arranged to receive DC supply Vin and to provide DC output $V_O$ such that DC output $V_O$ is less than DC supply Vin. Inductance sensor 930 is arranged to monitor inductance value Lval associated with buck converter 905.

When switching signal $\Phi_{SW}$ is not asserted, inductor current $I_{L1}$ does not pass through power transistor M7. Also, when switching signal $\Phi_{SW}$ is not asserted, inductor L1 provides inductor current $I_{L1}$ to output capacitor $C_O$ and/or to load 920. Switch node voltage $V_{SW}$ is generally at a level about equal to the voltage drop across diode D1 subtracted from a reference level of ground when switching signal $\Phi_{SW}$ is not asserted.

When switching signal $\Phi_{SW}$ is asserted, inductor current $I_{L1}$ passes through switch node $N_{SW}$ and power transistor M7. Also, when switching signal $\Phi_{SW}$ is asserted, inductor current $I_{L1}$ increases at a rate based, at least in part, on inductance value Lval of inductor L1.

Figure 10:
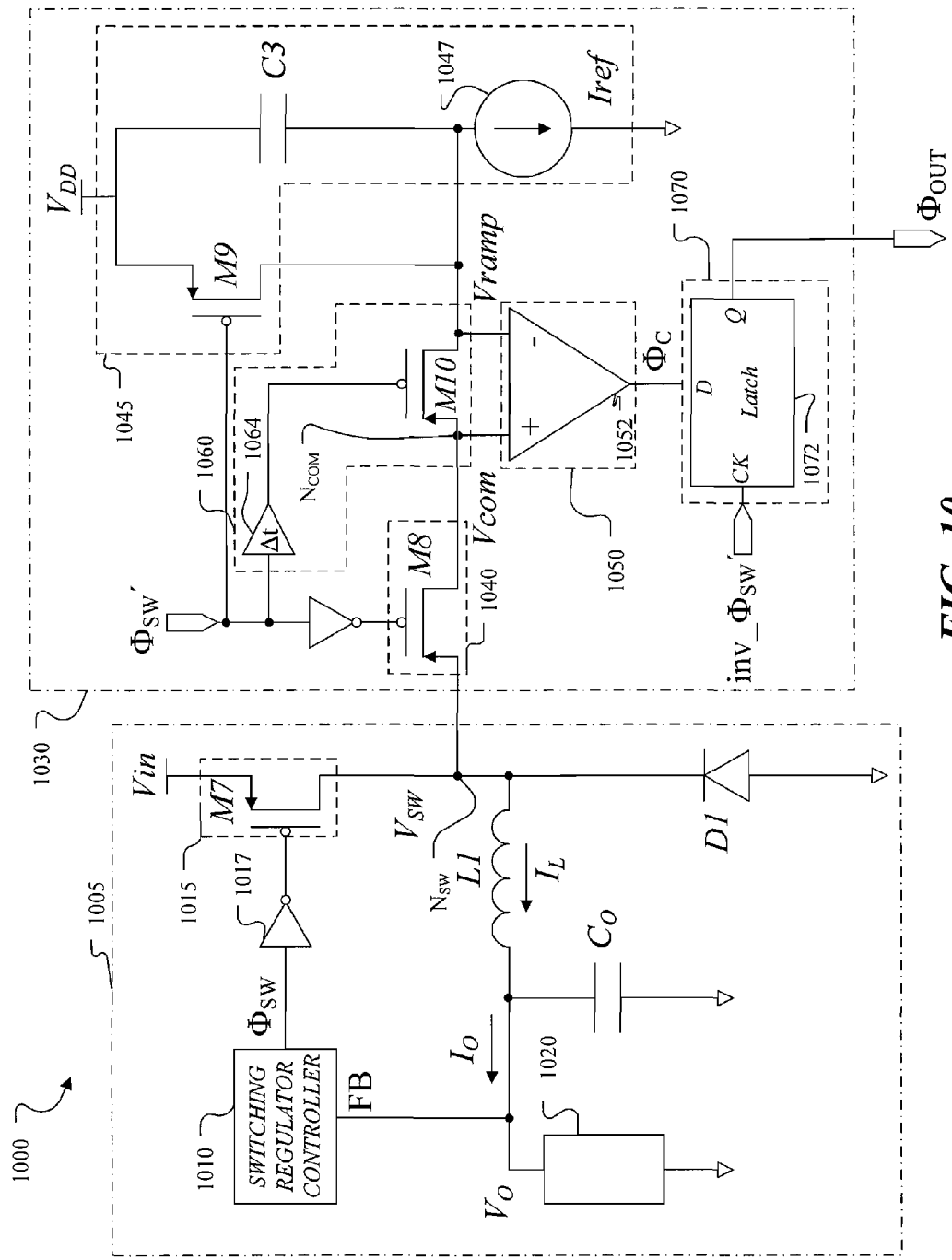
FIG. 10 is a schematic diagram showing an embodiment of the circuit of FIG. 9 in which the circuit includes an embodiment of a DC shift component and an embodiment of a logic component.

FIG. 10 is a block diagram of an embodiment of a circuit (1000) which may be employed as an embodiment of the circuit (900) of FIG. 9. In this embodiment, inductance sensor 1030 further includes ramp circuit 1045 and DC shift component 1060.

Ramp circuit 1045 includes capacitor C3, current source 1047, and transistor M9 arranged in a manner that is generally similar to ramp circuit 745 of FIG. 7. DC shift component 1060 includes delay gate 1064 with delay time Δt and transistor M10. In general, ramp circuit 1045 and DC shift component 1060 are arranged such that they provide ramp voltage Vramp as dictated by Equation 11.

Comparator 1052 is arranged to trip by comparing comparison input voltage Vcom with ramp voltage Vramp. The trip point of comparator 1052 may be determined by setting Equation 4 equal to Equation 11 and solving for predetermined threshold inductance Lmin. The predetermined threshold inductance Lmin may have a value as dictated by Equation 9, where inductor voltage $V_{L1}$ is approximately equal to DC supply Vin minus DC output $V_O$ as follows:

$$L\min = \frac{R_{SW}(Vin - Vo)C2}{Iref} \quad (13)$$

Figure 11:
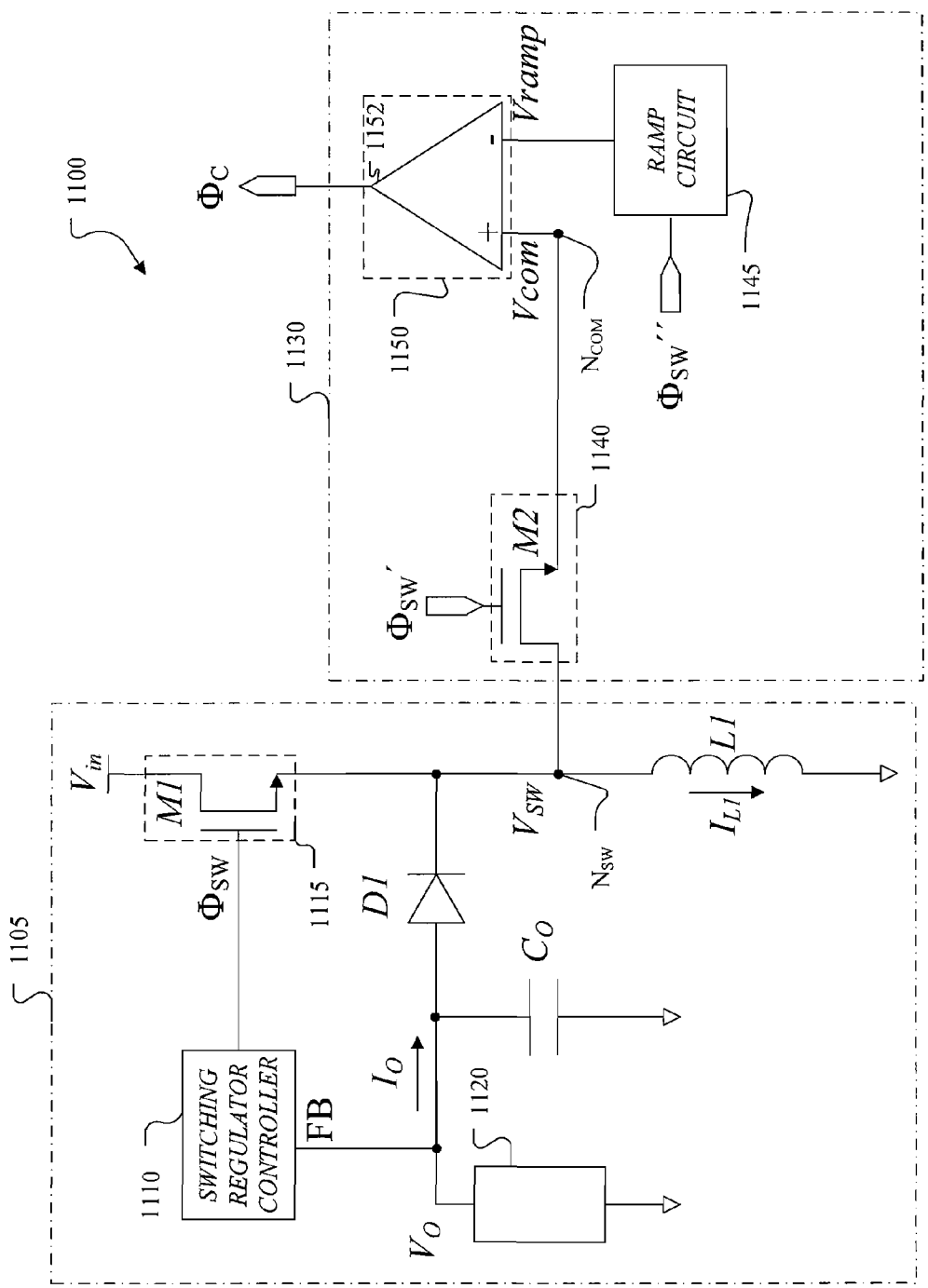
FIG. 11 is a block diagram of still yet another embodiment of the circuit of FIG. 1.

FIG. 11 is a block diagram of an embodiment of a circuit (1100), which may be employed as an embodiment of the circuit (100) of FIG. 1.

Similar to boost converter 205, inverting converter 1105 includes diode D1 and output capacitor $C_O$. Switching regulator controller 1110 is also arranged to receive feedback signal FB. In addition, switch 1115 includes power transistor M1, and power transistor M1 is coupled to switching regulator controller 1110. Also, similar to switch 240, switch 1140 includes transistor M2.

Inverting converter 1105 is arranged to receive DC supply Vin and to provide DC output $V_O$ such that DC output $V_O$ is greater in magnitude than DC supply Vin and DC output $V_O$ is inverted relative to DC supply Vin. Inductance sensor 1130 is arranged to monitor inductance value Lval associated with inverting converter 1105.

When switching signal $\Phi_{SW}$ is not asserted, inductor current $I_{L1}$ does not pass through power transistor M1. Also, when switching signal $\Phi_{SW}$ is not asserted, inductor L1 provides inductor current $I_{L1}$ to output capacitor $C_O$ and/or to load 1120. Switch node voltage $V_{SW}$ is generally at a level about equal to the DC output $V_O$ minus the voltage drop across diode D1 when switching signal $\Phi_{SW}$ is not asserted.

When switching signal $\Phi_{SW}$ is asserted, inductor current $I_{L1}$ passes through switch node $N_{SW}$ and power transistor M1. Also, when switching signal $\Phi_{SW}$ is asserted, inductor current $I_{L1}$ increases at a rate based, at least in part, on inductance value Lval of inductor L1.

In other embodiments, inductance sensors can be coupled to other types of switching regulators. For example, in one embodiment, an inductance sensor can be coupled to a switch node of a buck-boost converter. In another embodiment, an inductance sensor can be coupled to a switch node of an inverting converter.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for regulation, comprising:
   a switching regulator controller that is arranged to provide a switching signal;
   a switch that is coupled between a switch node and a comparison node, wherein the switch is arranged to receive a control signal that is based, at least in part, on the switching signal;
   a ramp circuit arranged to provide a ramp voltage; and
   a comparison circuit having at least a first input that is coupled to the comparison node, a second input, and an output, wherein the comparison circuit is arranged to receive the ramp voltage at the second input, and wherein the comparison circuit is configured to provide a comparison signal at the output such that the comparison signal is based, at least in part, on a comparison between the ramp voltage and a comparison input voltage at the comparison node, and such that the comparison signal is indicative of whether an inductance value is less than or equal to a predetermined threshold inductance value based, at least in part, on the comparison between the ramp voltage and the comparison input voltage.

2. The circuit of claim 1, wherein the comparison circuit includes a comparator.

3. The circuit of claim 1, further comprising a switching regulator, wherein the switching regulator includes the switching regulator controller and another switch having at least a control input, wherein said another switch is coupled to the switch node, and wherein said another switch is arranged to receive the switching signal at the control input.

4. The circuit of claim 1, further comprising a logic component that is arranged to receive the comparison signal and a signal that is based, at least in part, on the switching signal, wherein the logic component is arranged to provide an output signal that is based, at least in part, on a logic operation carried out on the comparison signal and the switching signal.

5. The circuit of claim 1, further comprising a DC shift component that is configured to align the comparison input voltage and the ramp voltage such that the comparison circuit compares a first rate of change associated with the comparison input voltage with a second rate of change associated with the ramp voltage.

6. The circuit of claim 5, wherein the switch is coupled to a capacitor node, and wherein the DC shift component includes:
   a capacitor that is coupled between the capacitor node and the comparison node;
   a first transistor that is coupled to the capacitor node, wherein the transistor is arranged to receive a first control signal that is based, at least in part, on the switching signal; and
   a second transistor that is coupled to the comparison node, wherein the second transistor is arranged to receive a second control signal that is based, at least in part, on the first control signal and a delay in the first control signal.

7. The circuit of claim 5, wherein the DC shift component includes:
   a first transistor that is coupled to the second input of the comparison circuit, wherein the first transistor is arranged to receive a first control signal that is based, at least in part, on the switching signal; and
   a second transistor that is coupled to the switch, wherein the second transistor is arranged to receive a second control signal that is based, at least in part, on the first control signal and a delay in the first control signal.

8. The circuit of claim 1, wherein the ramp circuit includes:
   a capacitor that is coupled to the second input of the comparison circuit;
   another switch that is coupled to the second input of the comparison circuit, wherein said another switch is arranged to receive a control signal that is based, at least in part, on the switching signal; and a current source that is coupled to the second input of the comparison circuit.

9. A circuit for regulation, comprising:

a switching regulator controller that is arranged to provide a switching signal;

a switch that is coupled between a switch node and a comparison node, wherein the switch is arranged to receive a control signal that is based, at least in part, on the switching signal;

a ramp circuit arranged to provide a ramp voltage;

a comparison circuit having at least a first input that is coupled to the comparison node, a second input, and an output, wherein the comparison circuit is arranged to receive the ramp voltage at the second input, and wherein the comparison circuit is configured to provide a comparison signal at the output such that the comparison signal is based, at least in part, on a comparison between the ramp voltage and a comparison input voltage at the comparison node, wherein the ramp circuit includes:

a capacitor that is coupled to the second input of the comparison circuit;

another switch that is coupled to the second input of the comparison circuit, wherein said another switch is arranged to receive a control signal that is based, at least in part, on the switching signal; and a current source that is coupled to the second input of the comparison circuit; and an inductor, wherein the current source is arranged to provide a reference current, and wherein the comparison circuit includes a comparator that is arranged to trip when an inductance value of the inductor reaches a predetermined threshold inductance value given by $$\frac{R_{SW} V_L C}{Iref},$$

where $R_{SW}$ represents an on-resistance of the switch, $V_L$ represents a voltage across the inductor, C represents a capacitance of the capacitor, and Iref represents the reference current.

10. A circuit for regulation, comprising:

an inductor that is coupled to a switch node;

a first switch that is coupled to the switch node, wherein the first switch has at least a control input, and wherein the first switch is arranged to receive a switching signal at the control input of the first switch;

a second switch that is coupled to the switch node, wherein the second switch has at least a control input, wherein the second switch is arranged to receive a switch control signal at the control input of the second switch, and wherein the switch control signal is based, at least in part, on the switching signal;

a ramp circuit that is arranged to provide a ramp voltage; and a comparator having at least a first input and a second input, wherein the first input is coupled to the switch node via the second switch, and the second input is coupled to the ramp circuit, wherein the comparator is arranged to provide a comparator output signal such that the comparison signal is indicative of whether an inductance value is less than or equal to a predetermined threshold inductance value based, at least in part, on the comparison between the ramp voltage and a comparison input voltage at the first input of the comparator.

11. The circuit of claim 10, further comprising a DC shift component that is configured to DC offset at least one of the ramp voltage and a switch node voltage at the switch node.

12. The circuit of claim 10, further comprising a switching regulator controller that is arranged to provide the switching signal, wherein the switching regulator controller includes at least one of a pulse width modulation regulator controller, a hysteretic bang-bang regulator controller, and a constant on-time regulator controller.

13. The circuit of claim 10, wherein the ramp circuit is arranged to receive a ramp control signal that is based, at least in part, on the switching signal, and wherein the ramp circuit is further arranged to provide the ramp voltage such that the ramp voltage changes at a generally monotonic rate when the ramp control signal is asserted.

14. The circuit of claim 10, wherein the comparator is arranged to trip when the inductance value reaches the predetermined threshold inductance value, and wherein the predetermined threshold inductance value is based, at least in part, on the constant rate of the ramp voltage, wherein the inductance value is the inductance value of an inductor.

15. The circuit of claim 14, wherein the predetermined threshold inductance value is also based, at least in part, on an on-resistance associated with the first switch.

16. A method for monitoring a switching regulator, the method comprising:

receiving a comparison input voltage that is based, at least in part, on an inductance value associated with the switching regulator;

receiving a ramp voltage that is based, at least in part, on a predetermined threshold inductance value;

comparing the comparison input voltage to the ramp voltage; and providing a signal indicative of whether the inductance value is less than or equal to the predetermined threshold inductance value based, at least in part, on the comparison between the comparison input voltage and the ramp voltage.

17. The method of claim 16, further comprising converting an input signal into an output signal such that the output signal is regulated, wherein converting the input signal includes:

providing a switching signal based, at least in part, on the output signal;

providing an inductor current that is based, at least in part, on the switching signal;

if the switching signal is asserted, providing the comparison input voltage such that the comparison input voltage is further based, at least in part, on an on-resistance of a switch, else, providing at least a portion of the inductor current to an output capacitor; and providing the output signal such that the output signal is based, at least in part, on a voltage stored across the output capacitor.

18. The method of claim 17, further comprising:

providing the comparison input voltage such that the comparison input voltage generally changes at a rate based, at least in part, on the inductance value;

receiving a ramp control signal that is based, at least in part, on the switching signal; and providing the ramp voltage such that the ramp voltage changes at a generally monotonic rate when the ramp control signal is asserted, wherein the ramp voltage is based, at least in part, on the predetermined threshold inductance value.

19. The method of claim 17, further comprising:
receiving a switch control signal at another switch, wherein the switch control signal is based, at least in part, on the switching signal, and wherein said another switch is coupled to a switch node of the switching regulator; and
if the switch control signal is asserted, receiving the comparison input voltage from the switch such that the comparison input voltage is further based, at least in part, on a switch node voltage at the switch node.

20. The method of claim 19, further comprising:
providing the comparison input voltage such that the comparison input voltage generally changes at a rate based, at least in part, on the inductance value;

receiving a ramp control signal that is based, at least in part, on the switching signal;

providing the ramp voltage such that the ramp voltage changes at a generally monotonic rate when the ramp control signal is asserted, wherein the ramp voltage is based, at least in part, on the predetermined threshold inductance value; and shifting at least one of the ramp voltage and the switch node voltage by a DC shift voltage.

\* \* \* \* \*

UNITED STATES PATENT AND TRADEMARK OFFICE
CERTIFICATE OF CORRECTION

| | | |
|---|---|---|
| PATENT NO. | : 8,018,215 B1 | Page 1 of 1 |
| APPLICATION NO. | : 12/147427 | |
| DATED | : September 13, 2011 | |
| INVENTOR(S) | : Nathanael Griesert et al. | |

It is certified that error appears in the above-identified patent and that said Letters Patent is hereby corrected as shown below:

In column 4, line 9, delete "$\Phi_{SW}$'" insert -- "$\Phi_{SW}$" --, therefor.

In column 4, line 36, delete "Vramp initial." and insert -- Vramp_initial. --, therefor, in column 4, line 40, delete "Vramp initial" and insert -- Vramp_initial --, therefor.

In column 5, line 41, delete "ouput" and insert -- output --, therefor.

In column 6, line 14, delete "Vo" and insert -- $V_O$ --, therefor.

in column 7, line 14, delete "Vramp_intial" and insert -- Vramp_initial --, therefor.

In column 7, line 15, delete "Vramp initial" and insert -- Vramp_initial --, therefor.

In column 8, lines 16-17, delete "Vramp initial" and insert -- Vramp_initial --, therefor.

In column 9, lines 32-35, delete "FIG. 7 is a block diagram of an embodiment of a circuit (700), which may be employed as an embodiment of the circuit (400) of FIG. 4." and insert the same as below "to latch high." on Col. 9, Line 33 as a New Paragraph.

In column 9, line 51, delete "Vramp initial" and insert -- Vramp_initial --, therefor.

Signed and Sealed this
Twenty-ninth Day of November, 2011

David J. Kappos
*Director of the United States Patent and Trademark Office*